United States Patent [19]
Masterson

[11] Patent Number: 6,119,368
[45] Date of Patent: Sep. 19, 2000

[54] APPARATUS FOR REDUCING COOL CHAMBER PARTICLES

[75] Inventor: Sean P. Masterson, Costa Mesa, Calif.

[73] Assignee: Conexant Systems, Inc., Newport Beach, Calif.

[21] Appl. No.: 09/070,372

[22] Filed: Apr. 30, 1998

[51] Int. Cl.[7] ...................................................... F26B 3/18
[52] U.S. Cl. .................................. 34/404; 34/410; 34/428
[58] Field of Search ............................... 34/218, 428, 60, 34/565, 404, 92, 410, 411

[56] References Cited

U.S. PATENT DOCUMENTS

| | | | |
|---|---|---|---|
| 5,199,483 | 4/1993 | Bahng | 165/1 |
| 5,937,541 | 8/1999 | Weigand et al. | 34/565 |

Primary Examiner—Henry Bennett
Assistant Examiner—Malik N. Drake

[57] ABSTRACT

An improved cool chamber is provided which includes a gas manifold for redistributing the gas flow and reducing the velocity of the gas particles that are directed towards a wafer. The gas manifold has a generally circular body that defines a plurality of outlets. A plurality of tubes, each having a first end and a second end, extend from the body. The first end is coupled to the body at the outlets. A vent diffuser is coupled to the second end of each tube. The vent diffuser includes a sintered gasket for providing point-of-use filtering of the gas and diffusion of the gas. The gas manifold is at a height different from the height of the plane of the wafer. An adapter plate that includes a bypass port is also provided. The bypass port is employed to conduct gas from the gas manifold back into the chamber during de-pressurization.

12 Claims, 9 Drawing Sheets

APPARATUS FOR REDUCING COOL CHAMBER PARTICLES

BACKGROUND OF THE INVENTION

1. Field of the Invention

The present invention relates to wafer processing systems, and in particular, to a manifold for reducing unwanted particles generated in a cool chamber.

2. Description of the Prior Art

Semiconductor wafer processing is a complex procedure performed by large semiconductor wafer processing systems that include many chambers where the semiconductor wafers are processed.

Wafer processing systems employ cool chambers for cooling wafers that have been heated to high temperatures in other processing chambers. For example, in physical vapor deposition (PVD) chambers, wafers are exposed to plasma and heaters that can heat the wafers to high temperatures, such as temperatures in the 200 to 300 degrees Celsius range. Thereafter, the wafers must be cooled before removing the wafers from the system. Cool chambers are provided for this purpose.

FIG. 1 illustrates a conventional cool chamber 2 that employs a single inlet port 4 that allows a cooling gas to flow into the chamber 2 and onto a wafer 7. Cool chambers 2 operate on the principle that when the pressure of the chamber 2 is elevated by filling the chamber 2 with a gas, the gas molecules provide a conduction medium to pull heat away from the wafer 7 and transfer the heat to the gas molecules. An inert gas, such as Argon, can be used to fill the cool chamber 2. The chamber 2 includes a wafer pedestal 6 that supports the wafer 7. It should be noted that the inlet port 4 is at a height that is approximately at the height of the top surface of the wafer pedestal 6. Accordingly, the gas is directed at about the same horizontal plane in which the wafer 7 is disposed. For example, the gas can be regulated to enter the cool chamber at a rate of 200 mTorr/sec for 10 seconds. After an additional 30 seconds (i.e., the approximate time needed for the wafer 7 to cool to a sufficiently low temperature), the wafer 7 is removed from the cool chamber 2.

Unfortunately, conventional cool chambers suffer from several drawbacks. First, since the gas is directed to flow, in a concentrated manner, from a single inlet 4 towards the wafer 7 in the plane of the wafer 7, the high velocity gas particles have a propensity to dislodge or stir up unwanted particles from the wafer 7 or the wafer pedestal 6. These unwanted particles can contaminate the wafer 7 and adversely affect the final product (e.g., the integrated circuit). In fact, a high particle level in any process chamber is known to adversely affect manufacturing yields. For example, the bottom surface of the wafer 7 may have accumulated particles from the other process chambers that may now be dislodged by the gas. Moreover, the wafer pedestal 6 itself can have residue particles from a previous wafer or other source, which also can be dislodged by the gas.

Second, the gas tends to cause the wafer 7 to slide on the pedestal 6. Unfortunately, any movement, even slight movement, can cause particle generation by the abrasive rubbing of the wafer 7 against the pedestal 6. For example, particles can be generated by the pedestal surface rubbing against the film deposited on the bottom surface of the wafer 7.

To address these problems, attempts were made to reduce the inlet gas flow. However, by reducing the inlet gas flow, the processing time to cool a wafer is increased significantly. In addition, since all wafers must go through the cool chamber, the increased processing time to cool the wafer increases the processing time for all wafers that proceed through the wafer processing system.

An alternative approach to this problem is to employ fingers to hold the wafer 7 in place on the pedestal 6 to reduce the likelihood of movement of the wafer 7. Unfortunately, this approach suffers from the following drawbacks. First, the fingers used to hold the wafer 7 can also dislodge particles from the top surface of the wafer 7. Second, although this approach reduces the likelihood of movement of the wafer 7, it does not eliminate the possibility of such movement. Third, this approach does not adequately address the situation where the gas flowing towards the wafer 7 can dislodge particles and increase the number of unwanted particles in the chamber 2 which, as explained previously, reduces manufacturing yields in processing.

Accordingly, there remains a need for a method and apparatus for reducing the generation of unwanted particles in a cool chamber that overcomes the problems set forth above.

SUMMARY OF THE DISCLOSURE

It is therefore an object of the present invention to provide a method and apparatus for reducing the generation of unwanted particles in the cool chamber that overcomes the above-referenced problems.

It is yet another object of the present invention to provide a wafer processing system that employs an improved cool chamber having a manifold with a plurality of outlets to reduce and redistribute the velocity of the gas particles introduced into the chamber.

It is yet another object of the present invention to provide a wafer processing system that employs an improved cool chamber having a manifold with a plurality of outlets to redirect the inflowing gas.

It is still another object of the present invention to provide an improved cool chamber having an adapter plate with a bypass port assembly for conducting gas from the manifold back into the cool chamber for maintaining the pressure in the cool chamber at a level consistent with the pressures experienced by conventional cool chambers. The bypass port assembly creates a secondary gas inlet that has an increase in total volume pumping.

It is yet a further object of the present invention to provide an improved cool chamber having a manifold that provides point-of-use filtering and diffusing on the inflowing gas.

In order to accomplish the objects of the present invention, there is provided a cool chamber having a gas manifold for redistributing the gas flow and reducing the velocity of the gas particles introduced into the cool chamber and towards the wafer. The gas manifold has a generally circular body that defines a plurality of outlets. A plurality of tubes, each having a first end and a second end, extend from the body. The first end is coupled to the body at the outlets. A vent diffuser is coupled to the second end of each tube. The vent diffuser includes a sintered gasket for providing point-of-use filtering of the gas and diffusion of the gas. The gas manifold is at a height different from the height of the plane of the wafer. The cool chamber also includes an adapter plate that defines a bypass port. The bypass port communicates with a bypass port assembly that is employed to redirect gas from the cool chamber back into the chamber during de-pressurization.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims. In certain instances, detailed descriptions of well-known circuits and components are omitted so as to not obscure the description of the present invention with unnecessary detail.

Figure 1:
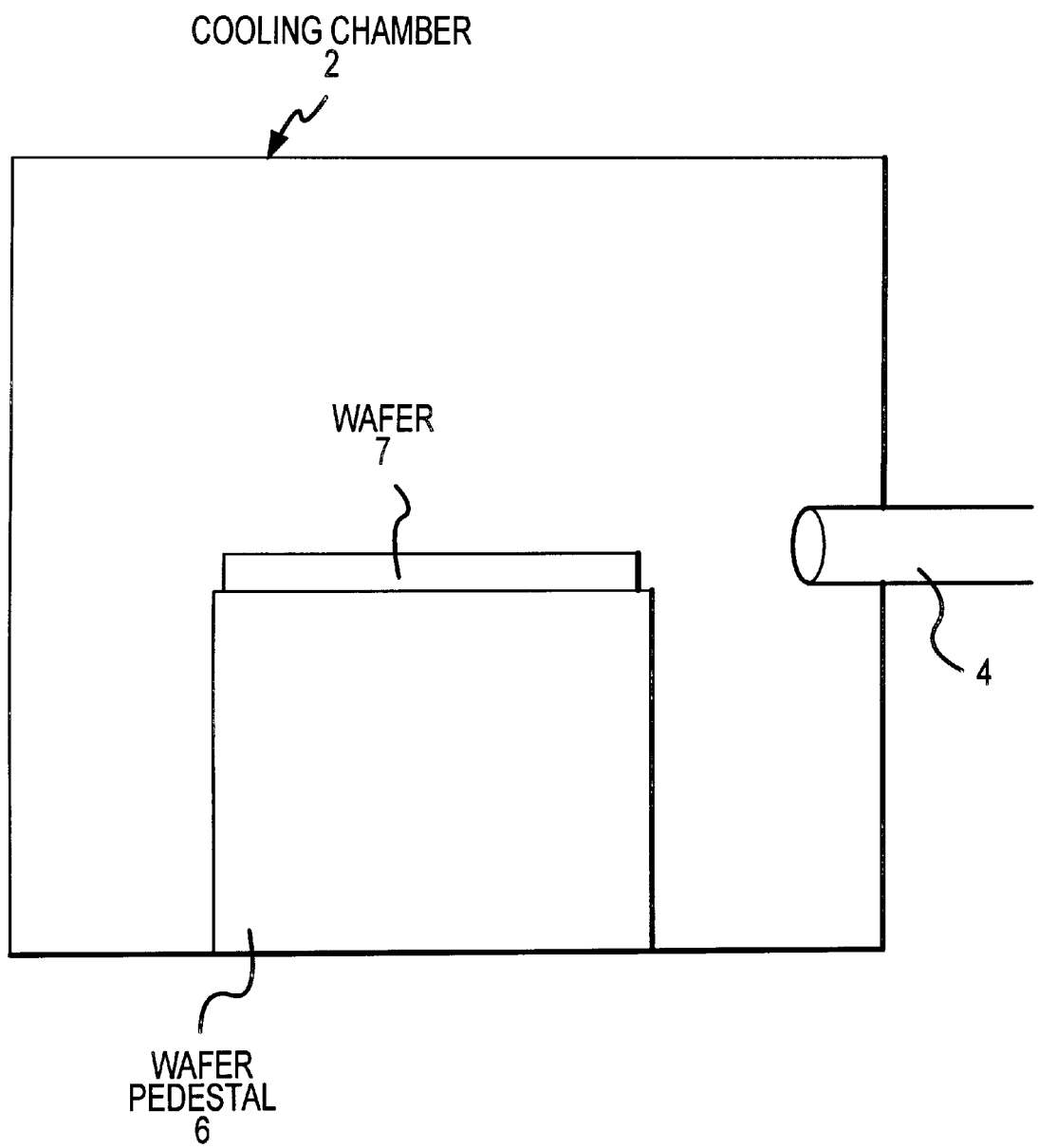
FIG. 1 illustrates a conventional cooling chamber.
Figure 2:
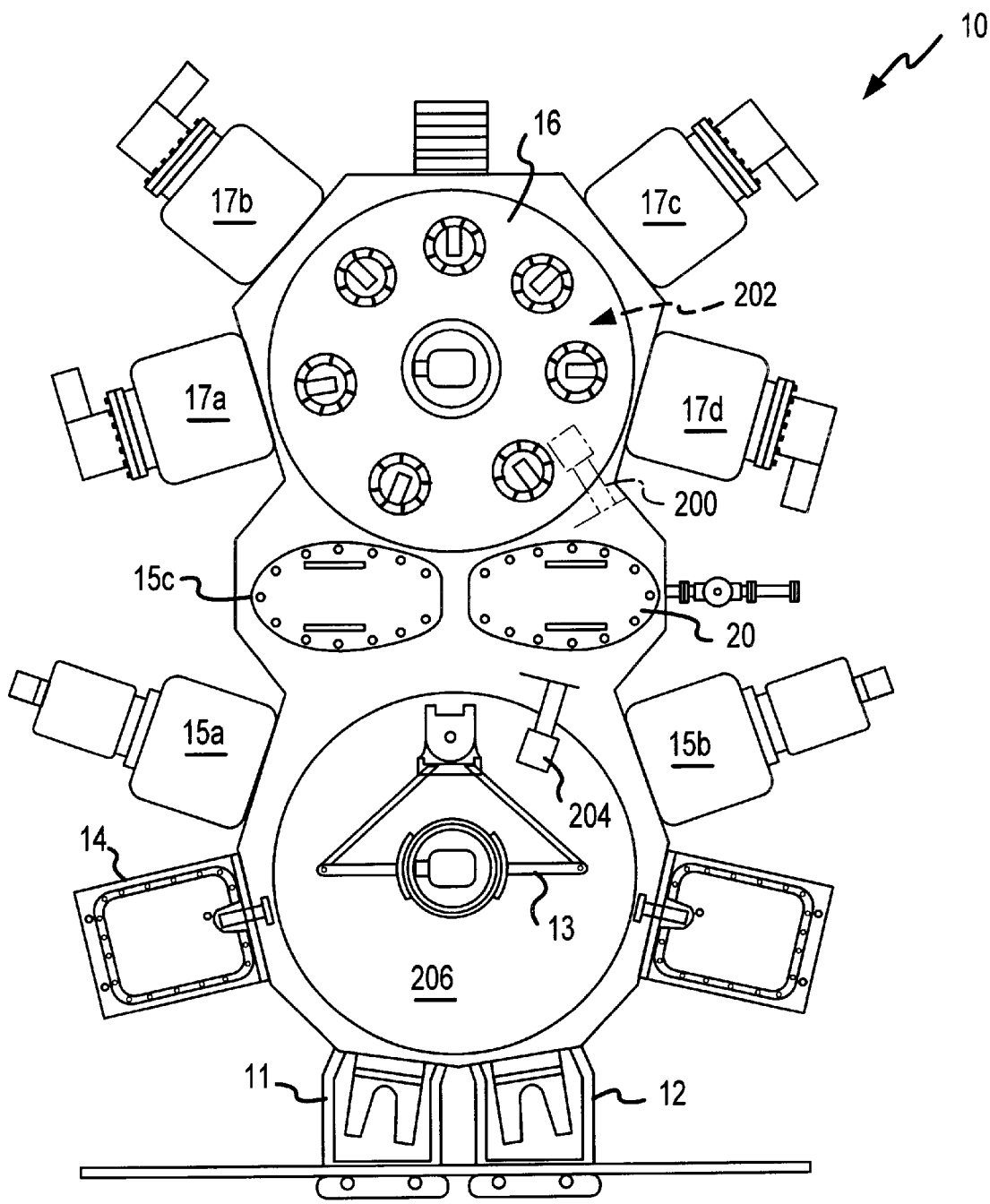
FIG. 2 is a top perspective view of a wafer processing system in which the present invention can be implemented.

FIG. 2 is a top perspective view of a wafer processing system 10 in which the present invention can be implemented. The system 10 includes a plurality of chambers, described in detail below, and two robot devices that move the wafers from one chamber to another. The system 10 has two wafer load locks 11, 12 into which wafers are loaded at the beginning of, and at the end of, the processing inside system 10. In particular, plastic cassettes can be placed onto these locks 11, 12, with the plastic cassettes adapted to hold the wafers. In operation, a cassette holding a number of wafers is first placed into the first load lock 11 by an operator. A first robot device 13, located in a buffer chamber 20b, then removes the wafers from the first load lock 11 and places the wafers into an "orient and de-gas" chamber 14. The "orient and de-gas" chamber 14 orients the notches on the wafers and desorbs gas from the wafers while also slightly preheating the wafers. Thereafter, the first robot device 13 removes the wafers from the "orient and de-gas" chamber 14 and places the wafers into one of three etch chambers 15a, 15b or 15c, where an etch can be applied (if necessary) to the wafers, such as through the use of RF plasma.

After etching, a second robot device (not shown) located under top cover 16 removes the wafers from the etch chamber 15 and places the wafers into one or more selected physical vapor deposition (PVD) chambers 17a, 17b, 17c, 17d. Each PVD chamber 17 applies a different type of metal (e.g., titanium, titanium nitride 101, aluminum, titanium nitride clamped, among others) to the wafers to form the interconnect metal lines. The application of metal is done at high temperatures, such as from 200 to 300 degrees Celsius. If it is desired to apply only one type of metal to the wafers, then the wafers are only placed in the one chamber 17a, 17b, 17c or 17d containing that type of metal. Similarly, if it is desired to apply three types of metal to the wafers, then the wafers are only placed in the selected chambers 17a, 17b, 17c or 17d containing the three specific types of metal. Likewise, if it is desired to apply four types of metal to the wafers, then the wafers are sequentially placed in all the chambers 17a, 17b, 17c and 17d. The second robot device simply removes the wafers from one chamber 17 and places the wafers into the next desired chamber 17, and repeats this operation until the wafers have been processed in all the desired PVD chambers 17. In other semiconductor wafer processing systems, it is possible to provide any number of these PVD chambers, with such number typically ranging from one to six.

When all the desired metal types have been applied to the wafers, the second robot device will remove the wafers from the last PVD chamber 17 where metal was applied, and places the wafers into a cool chamber 20, where the wafers are cooled. A gas, such as Argon, is introduced into the cool chamber 20 to produce a conduction medium to pull heat away from the wafers. The wafers must be cooled after processing, otherwise the high temperature of these wafers will melt the plastic cassettes that are located in the second wafer load lock 12. After cooling, the first robot device 13 picks up the wafers, removes them from the cool chamber 20, and places the wafers into cassettes in one of the wafer load locks 11 or 12, where the wafers are stored until removed by the operator of the system 10.

The cool chamber 20 of the present invention will now be described in greater detail in connection with FIGS. 3 to 9. As explained in greater detail hereinbelow, the cool chamber 20 of the present invention provides a unique assembly that includes a manifold assembly 22, an adapter plate 24, and a novel bypass valve assembly 26. This unique assembly operates to evenly distribute the flow of cooling gas into the chamber, and to reduce the velocity of the gas particles introduced into the chamber from any single location, thereby minimizing the possibility of generating unwanted particles from inside the cool chamber 20. The cool chamber 20 of the present invention further provides a bypass valve assembly 26 that regulates and controls the vacuum level inside the cool chamber 20. The adapter plate 24 operates to provide an interface between the bypass valve assembly 26 and the interior of the cool chamber 20, including the manifold assembly 22.

Figure 3:
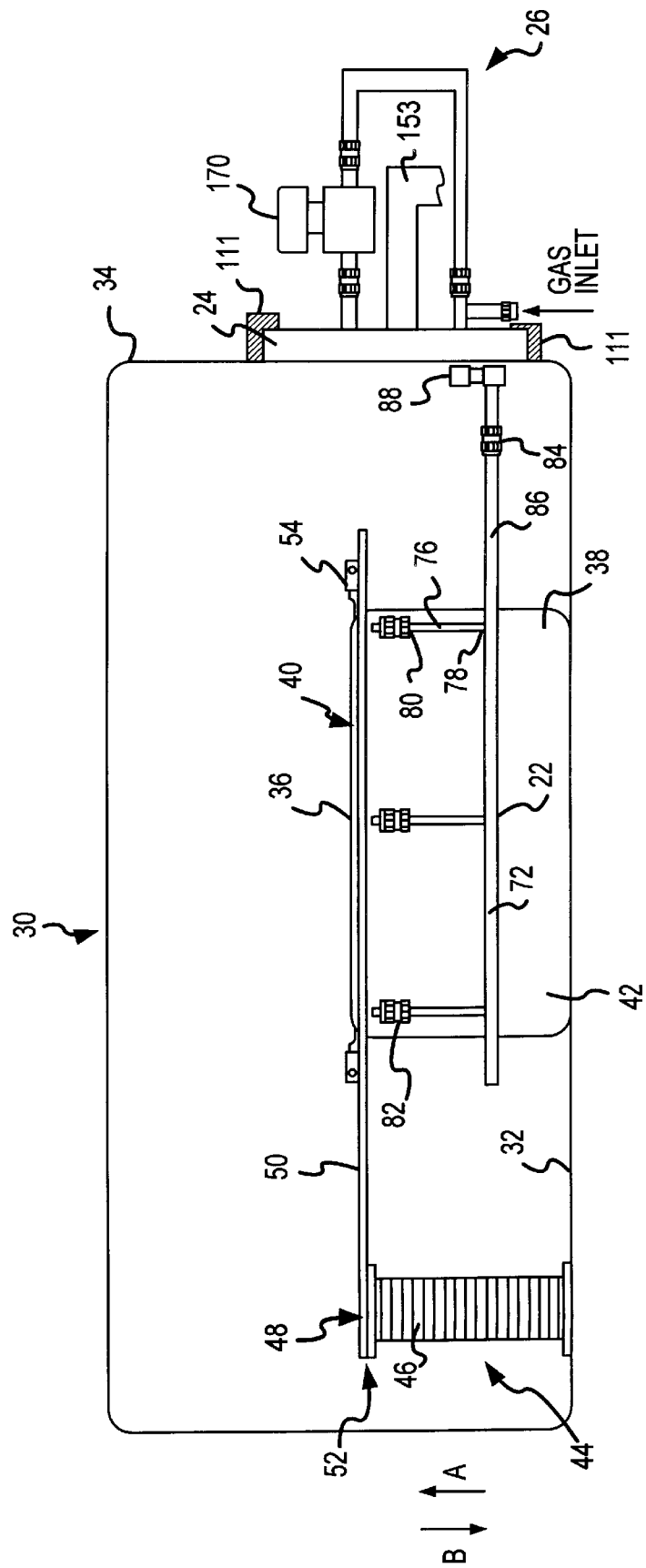
FIG. 3 is a break-away side view of a cool chamber configured in accordance with one embodiment of the present invention.
Figure 4:
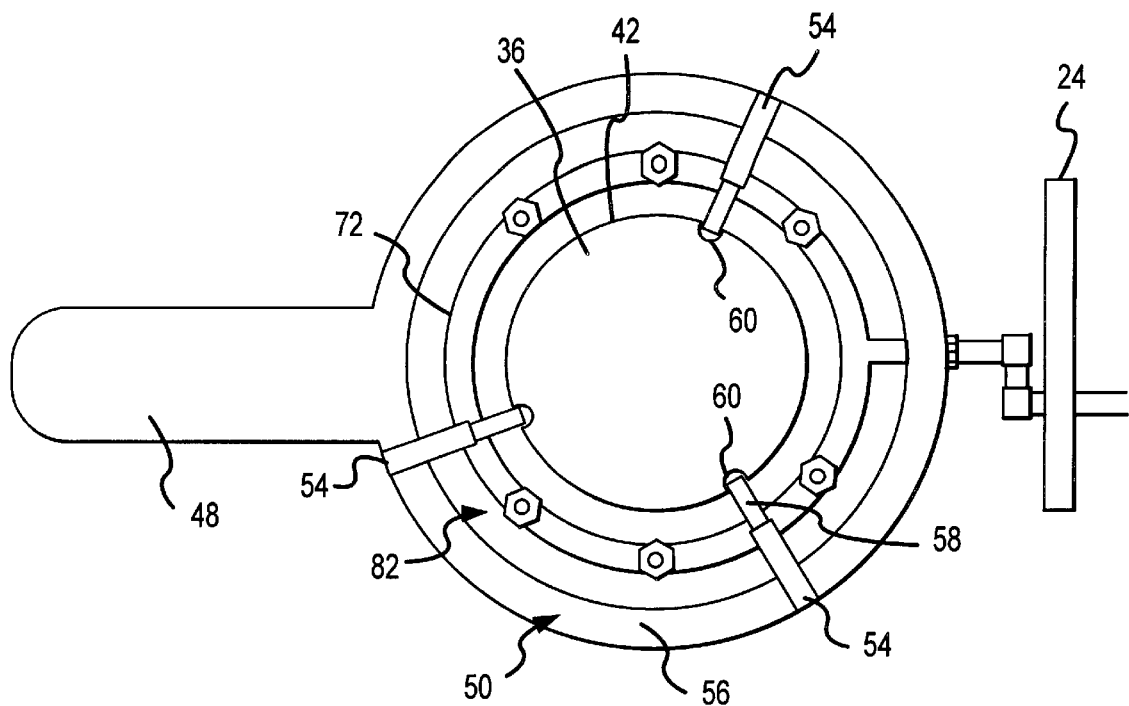
FIG. 4 is a top view of the cool chamber of FIG. 3.

Referring now to FIGS. 3 and 4, the cool chamber 20 has a chamber body 30 having bottom wall 32 and a generally tear-drop shape defined by a plurality of side walls including a side wall 34 for receiving the adapter plate 24. A wafer pedestal 36 extends and is supported from the bottom wall 32, and includes a generally cylindrical body 38 having an upper surface 40 and a cylindrical surface 42. The upper surface 40 of the wafer pedestal 36 supports a wafer (not shown) that is to be cooled. The diameter of the wafer is substantially the same as the diameter of the upper surface 40.

The cool chamber 20 also includes a wafer lift 44 that is coupled to the chamber body 30 and supported on the bottom wall 32. The wafer lift 44 has a generally cylindrical bellows assembly 46 that functions to isolate the internal vacuum from the external atmosphere. The bellows assembly 46 includes a support (not shown) and a movable portion 48, and can be vertically raised and lowered with respect to the support 46. The wafer lift 44 also includes a hoop 50 that is coupled to the movable portion 48 at a top surface 52 of the movable portion 48. Lift fingers 54 are provided on a top surface 56 of the hoop 50 for lifting the wafer off the wafer pedestal 36 and for placing the wafer onto the wafer pedestal 36. The lift fingers 54 are disposed approximately equidistant from each other around the perimeter of the hoop 50. In the embodiment illustrated in FIG. 4, three lift fingers 54 are used and are spaced apart from each other at an angle of approximately 120 degrees, although those skilled in the art will appreciate that more than three spaced-apart lift fingers 54 can be provided as well. Each lift finger 54 includes a support surface 58 for supporting a bottom surface of a wafer (not shown). The cylindrical surface 42 of the body 38 is provided with a plurality of indents 60 for receiving the lift fingers 54. The indents 60 allow the lift fingers 54 to access the bottom surface of the wafer even though the area of the wafer is substantially the same as the area of the upper surface 40 of the wafer pedestal 36.

Figure 5B:
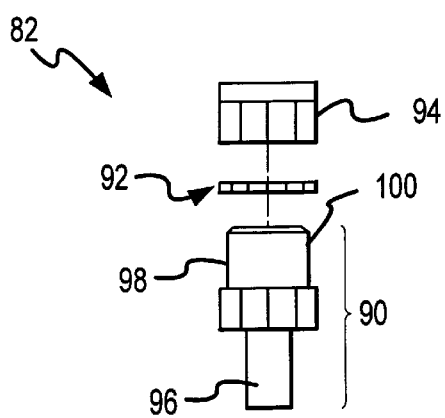
FIG. 5B is an exploded perspective view of the vent diffuser of FIG. 3 configured in accordance with one embodiment of the present invention.
Figure 5A:
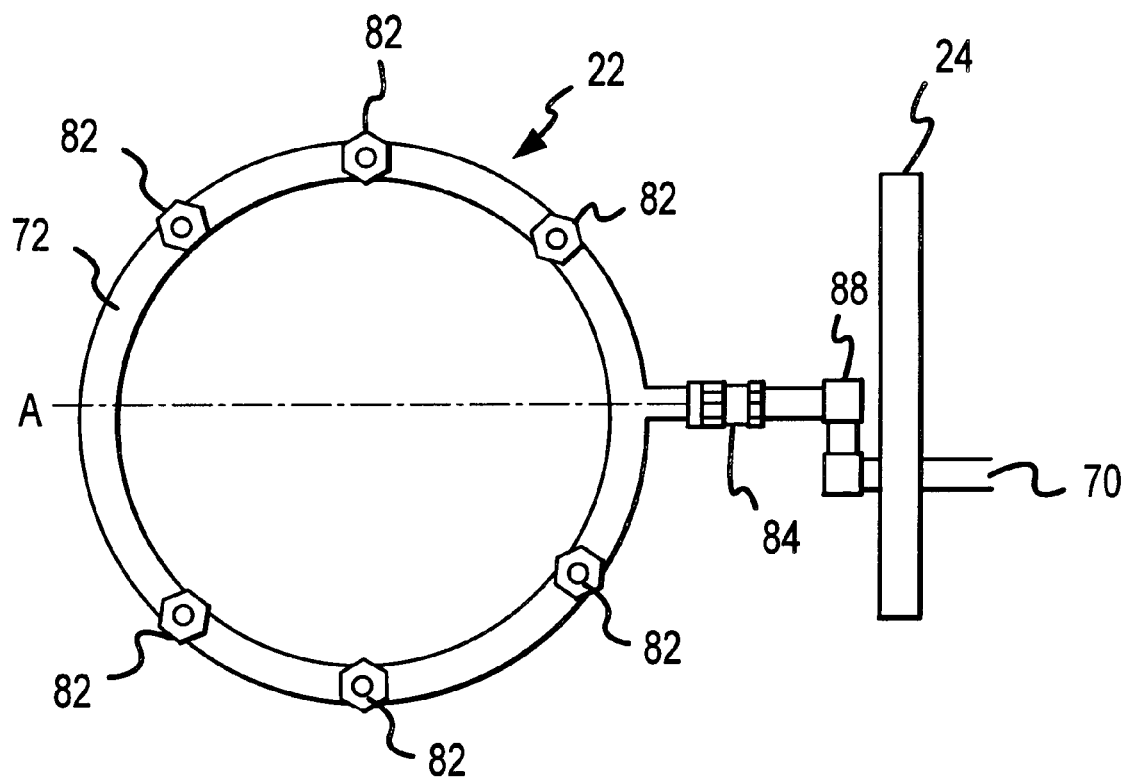
FIG. 5A is a top view of the manifold of FIG. 4 configured in accordance with one embodiment of the present invention.

The manifold assembly 22 is illustrated in greater detail in FIGS. 4 and 5A. The manifold assembly 22 is provided to re-direct the gas inflow from one location to a plurality of different locations. The manifold assembly 22 includes a pipe or tube that defines one or more outlets for conducting and re-directing gas from a gas source (not shown). The gas is transmitted or conveyed from outside the cool chamber 20 into the cool chamber 20 through a process fill port 70, which is described in greater detail below. In a preferred embodiment, the manifold assembly 22 includes a generally horizontally-disposed circular tube 72 that defines a plurality of outlets or holes. The circular tube 72 is positioned at a vertical level below (i.e., in a different horizontal plane) the wafer pedestal 36. The manifold 22 also includes a plurality of vertical tubes 76, each having a first end 78 that is coupled, such as by welding, to the circular tube 72 at the outlets, and a second end 80 that is coupled, such as by orbital welding, to a vent diffuser 82, which is described in greater detail below. In the preferred embodiment, six outlets 74 and six corresponding vertical tubes 76 are provided although these numbers can be varied. Furthermore, the outlets 74 and diffusers 82 are provided in two groups of three outlets 74 and diffusers 82 per group. For example, referring to FIG. 5A, one group of three diffusers 82 are provided on each side of the circular tube 72 divided by a central axis A defined by an internal fitting 84 that is described below. Each diffuser 82 in each group can be spaced apart from each other at an angular displacements of about fifty degrees, with the two outer diffusers 82 in each group spaced from the central axis A at an angular displacements of about forty degrees. These angular displacements can be varied as desired. For example, the six diffusers 82 can be evenly spaced around the circular tube 72 at 60 degree increments. In addition, in a preferred embodiment, the circular tube 72 can be made from a ¼" gas line and can have a diameter in the range of approximately 8 to 10 inches.

An internal fitting 84 is provided inside the cooling chamber 20 for connecting the manifold assembly 22 to the process fill port 70. The manifold assembly 22 further includes a connector 86 for removably coupling the lumen of the circular tube 72 to a first end of the internal fitting 84. In a preferred embodiment, the internal fitting 84 can be a ¼" VCR™ fitting that is available from Cajon Corp. Also provided inside the cooling chamber 20 is a dual elbow joint 88 having a first end fixably coupled (such as by welding) to a second end of the internal fitting 84 and a second end fixably coupled (such as by welding) to the process fill port 70.

The vent diffusers 82 are now described in connection with FIG. 5B. However, it is important that the vent diffusers 82 should positioned so as not to direct gas flow directly at the bottom of the wafer, so that particles on the bottom of the wafer are not stirred or dislodged. For example, if the diameter of the pedestal 36 is greater than that of the wafer, then if the wafer is concentric with the pedestal 36, the flow of gas will not be directed at the bottom surface of the wafer. Other orientations and modifications are possible. For example, the vertical level of the circular tube 72 can be increased, and the configuration of the vertical tubes 76 oriented in a downward fashion, so that the vent diffusers 82 are diffusing gas towards the bottom of the chamber 20.

Each vent diffuser 82 includes a male gland 90, a sintered gasket 92 that forms a plurality of pores for diffusing gas, and a female gland 94 (i.e., a hollow mating nut) that is removably coupled to the male gland 90. In a preferred embodiment, the male gland 90 has a lower end 96 that is fixably coupled (such as by welding) to a vertical tube 76, and a cylindrical core 98 that is provided with external threads 100 that are adapted to be threadably engaged with internal threads provided inside the hollow interior of the mating nut 94. The sintered gasket 92 is interposed between the male gland 90 and mating nut 94, above the core 98 but inside the hollow interior of mating nut 94.

The vent diffuser 82 diffuses the gas to decrease both the velocity and direction of the gas at any one location. This diffusing effect further decreases the chance of dislodging particles from the wafer and the other elements of the cool chamber 20. The sintered gasket 92, in addition to being employed to diffuse the gas, can also be modified to provide a point-of-use filtering of particles that are greater than a predetermined size. For example, the sintered gasket 92 can define pores having a diameter of 0.1 um to 100 um, with a smaller pore size being effective in filtering particles. In the preferred embodiment, a filter is employed further upstream adjacent the process fill port 70, so the sintered gasket 92 can define pores having a size of approximately 60 um to 80 um and is used primarily for diffusing the gas.

In the preferred embodiment, the components of the manifold assembly 22, including the vent diffusers 82 and all tubing and fittings, are made from stainless steel. It will be understood by one of ordinary skill in the art that these elements can be made of other metals and materials that are suitable for transporting gas.

Figure 6:
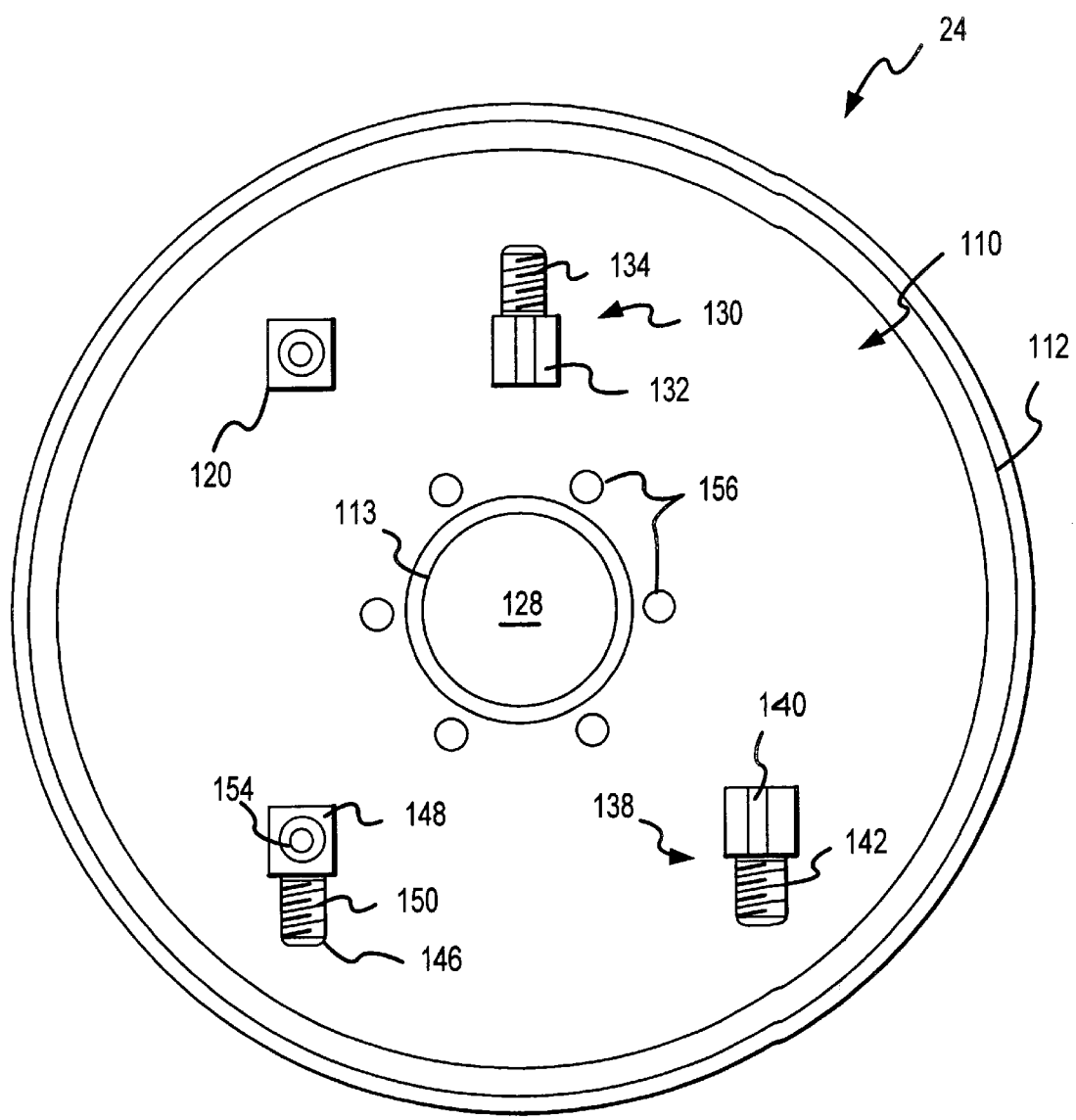
FIG. 6 is a front view of the adapter plate of FIG. 3 configured in accordance with one embodiment of the present invention.
Figure 7:
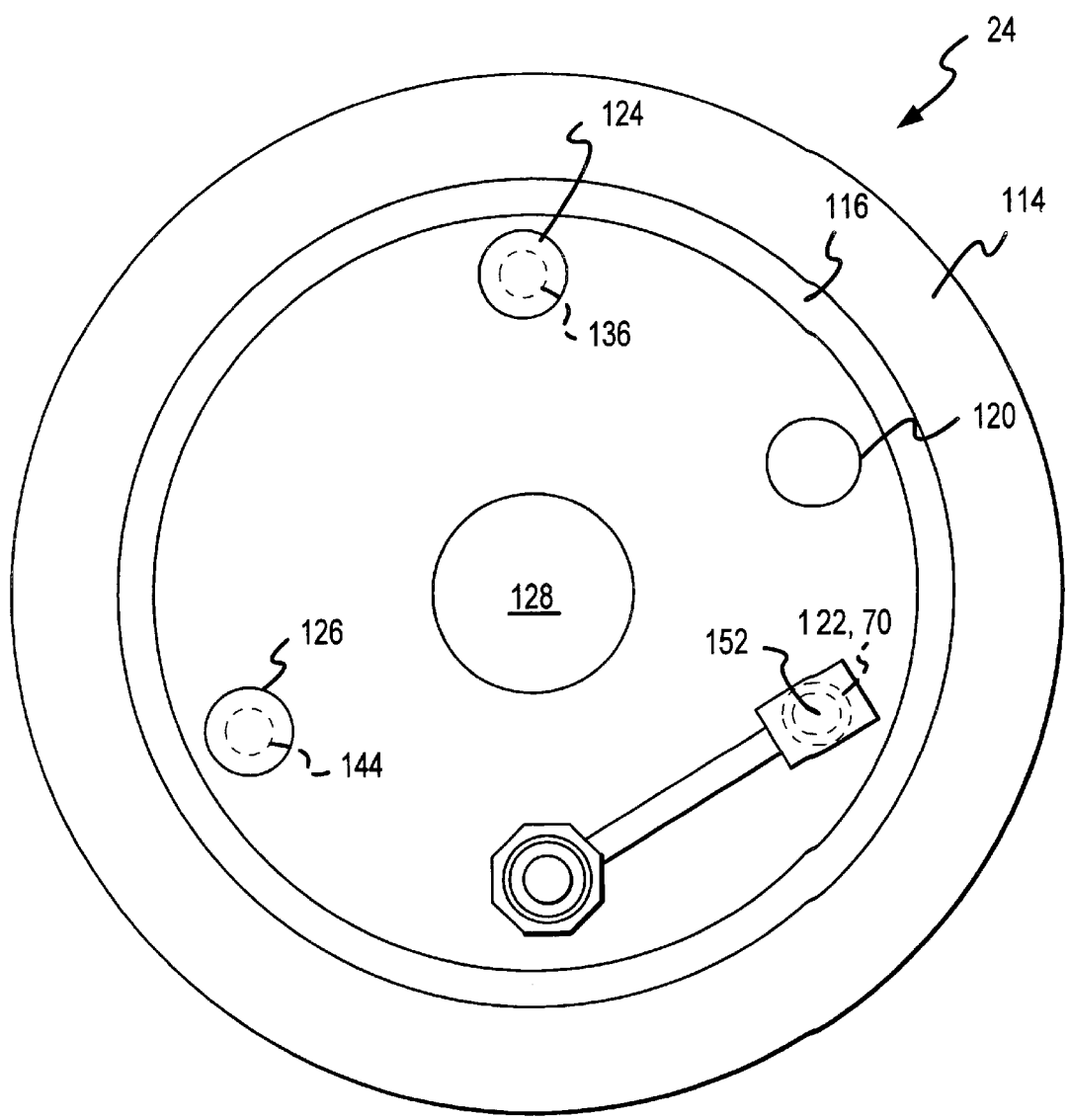
FIG. 7 is a rear view of the adapter plate of FIG. 6.
Figure 8:
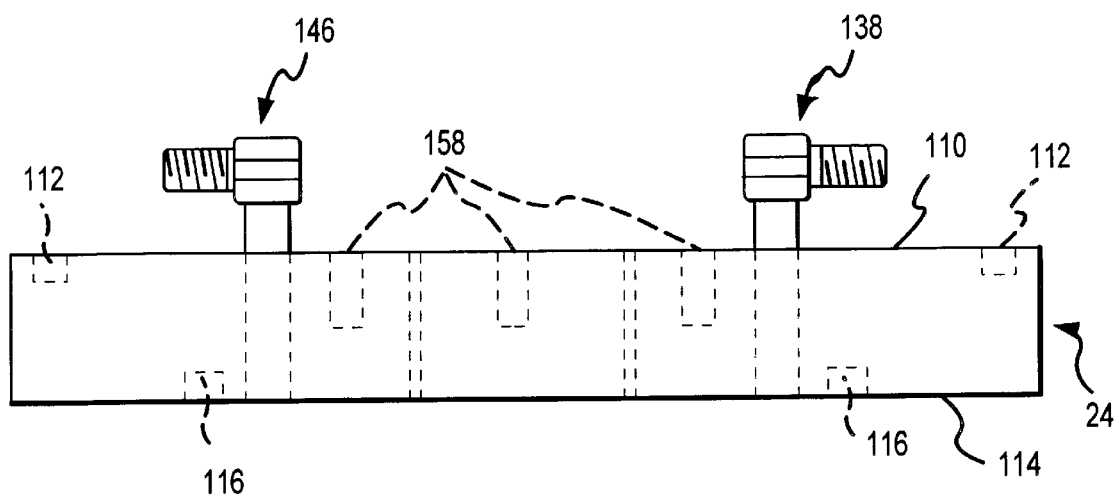
FIG. 8 is a side view of the adapter plate of FIG. 6.

The adapter plate 24 is illustrated in greater detail in FIGS. 6–8, which illustrate different views of the adapter plate 24 configured in accordance with one embodiment of the present invention. Specifically, FIG. 6 is a front view of the adapter plate 24, FIG. 7 is a rear view of the adapter plate 24, and FIG. 8 is a side view of the adapter plate 24. The adapter plate 24 can be generally circular, and has an outer surface 110 (see FIG. 6) that defines a first annular groove 112 that is adapted to receive protrusions on a clamp 111 that is secured to the chamber 20. This clamp 111 operates to hold the adapter plate 24 securely against the chamber 20. An annular surface 113 on the outer surface 110 receives a first O-ring (not shown). The adapter plate 28 also has an inner surface 114 (see FIG. 7) that defines a second annular groove 116 for receiving a second O-ring (not shown) that seals the adapter plate 24 to the cool chamber 20. The O-rings are provided to seal the interior of the cool chamber 20 from the outside environment at locations where there may be openings (i.e., the ports 120, 122, 124, 126, 128 and the bolts 156 described below), so as to produce and maintain the vacuum. In this regard, while the other parts of the cool chamber 20 are sealed by welding one part to another, the O-rings are used with the adapter plate 24 because the adapter plate 24 is a removable part.

The adapter plate 24 further includes a bypass port 120, a process fill port 122 that communicates with process fill port 70 described above, a pressure monitoring port 124, a vent port 126, and a vacuum port 128 (see FIG. 7). Each of these ports 120, 122, 124, 126, 128 extends completely through the adapter plate 24, each communicates with a respective port in the side wall 34 of the chamber 20, and each is coupled to an assembly for carrying out their respective functions. In addition, each of these ports 120, 122, 124, 126, 128 are preferably positioned inside the circumference defined by the O-ring groove 116 so that each port 120, 122, 124, 126, 128 can benefit from the sealing effect provided by the second O-ring.

For example, the adapter plate 24 is coupled to a pressure monitoring port assembly 130 (see FIG. 6) that includes an elbow portion 132, a first portion 134 for coupling to a pressure monitoring device (such as a gauge), and a second portion 136 (see FIG. 7) that extends through the pressure monitoring port 124 for flow communication with the interior of the cool chamber 20. In addition, the adapter plate 24 is also coupled to a vent port assembly 138 (see FIG. 6) that likewise includes an elbow portion 140, a first portion 142 for coupling to a vent line for venting to the atmosphere, and a second portion 144 (see FIG. 7) that extends through the venting port 126 for flow communication with the interior of the cool chamber 20.

The bypass port 120 of the adapter plate 24 is coupled to a bypass valve assembly 26, as explained in greater detail below. The adapter plate 24 is also coupled to a process fill port assembly 146 (see FIG. 6) that includes an T-shaped portion 148, a first portion 150 (i.e., gas inlet) for coupling to a gas source (not shown), a second portion 152 (see FIG. 7) that extends through the process fill port 122 for communication with fill port 70, and a third portion 154 for coupling to the bypass valve assembly 26.

In addition, a vacuum assembly 153 is coupled to the outer surface 110 of the adapter plate 24. The vacuum assembly 153 has a vacuum port (not shown) that communicates with the vacuum port 128 in the adapter plate 24. The vacuum port 128 in the adapter plate 24 is in flow communication with the interior of the cool chamber 20. A plurality of bolts 156 are screwed into bores 158, and operate to secure a flange (not shown) of the vacuum assembly 153 against the adapter plate 24.

Figure 9:
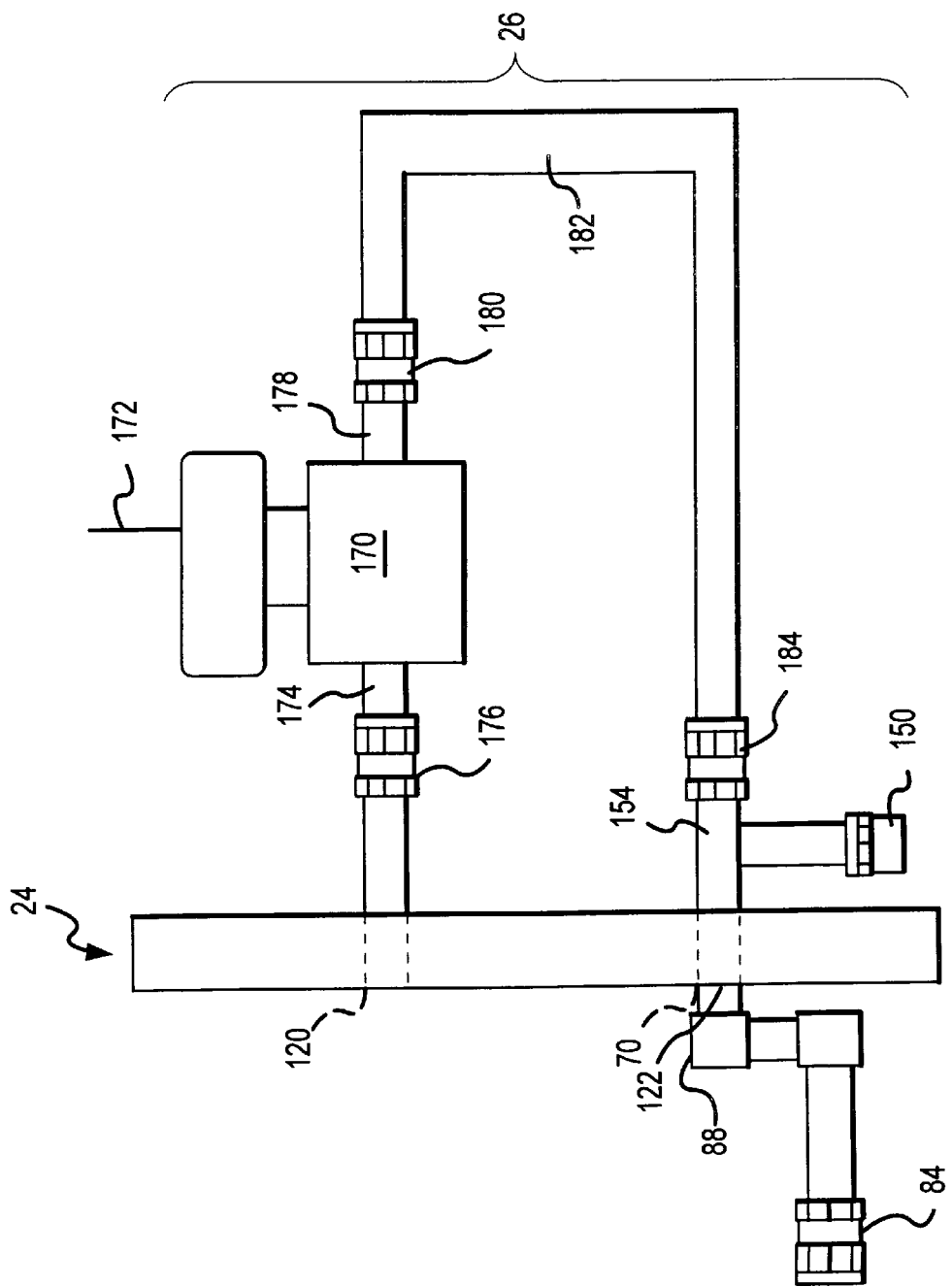
FIG. 9 illustrates in greater detail the bypass valve assembly of FIG. 3 connected between a bypass port and the process fill port of the adapter plate.

FIG. 9 illustrates in greater detail the connection between the bypass port 120 (which is in flow communication with the interior of the cool chamber 20) and the process fill port 122 of the adapter plate 24 and the bypass valve assembly 26. The bypass valve assembly 26 includes a bypass valve 170, a control line 172 for opening and closing the valve 170, a first port 174 coupled to a first fitting 176 and a second port 178 coupled to a second fitting 180. A U-shaped tube 182 connects the second fitting 180 to a third fitting 184 that is connected to the third portion 154 of the T-shaped portion 148 of the process fill assembly 146. The bypass valve 170 is normally biased into a closed position by a spring-loaded closer that is disposed in the valve assembly, and opens only when air is provided through the open control line 172.

In the preferred embodiment, the fittings, tubing, male and female glands 90, 94, adapter plate 24, and port assemblies are all made from stainless steel. It will be understood by one of ordinary skill in the art that these elements can be made of other metals and materials that are suitable for transporting gas. Moreover, in the preferred embodiment, the gas lines and fittings have a "roughness average" (RA) finish of about 10 micro-inches to reduce the likelihood of out-gassing (i.e., the possibility of gas particles trapped on the surface of the gas lines and fittings). The term, "roughness average" is an indication of surface roughness of a material. It will be understood by one of ordinary skill in the art that the gas lines and fittings can have an RA finish that is greater than or less than 10 micro-inches. It is desirable to minimize the RA finish of the materials used so that possibility of out-gassing is reduced.

The method of operation of the cool chamber 20 of the present invention will now be described in connection with FIGS. 2, 3 and 9. First, an isolation valve 200, which is disposed between the transfer chamber 202 (shown in phantom but is in reality under top cover 16) and the cool chamber 20, is opened. It will be understood by those of ordinary skill in the art that the isolation valve referred to herein can be controlled by air. For example, the isolation valve 200 can be opened by a first air line (i.e., the open control line) and closed by a second air line (i.e., the closed control line). Accordingly, when the following description refers to the opening and closing of an isolation valve 200, it is the appropriate control line, associated with the valve 200, that is provided with air to accomplish either the opening or closing of the valve 200.

Next, a wafer is transferred into the cooling chamber 20 by the second robot device via an opening that is closed by the isolation valve 200. Specifically, the wafer sits on a blade of the second robot device and is delivered by this blade. The lift hoop 50 is moved upwardly in the vertical direction indicated by the arrow denoted "A" in FIG. 3, and the lift fingers 54 are raised to contact the outer edge of the wafer. The blade is then retracted into the transfer chamber 202, and the isolation valve 200 between the transfer chamber 202 and the cool chamber 20 is closed. The lift hoop 50 is them lowered in the vertical direction indicated by the arrow denoted "B", to place the wafer on the wafer pedestal 36. All the steps described above to this point, including the operation of the second robot device and the lift hoop 50, are carried out by conventional wafer processing systems, and are well-known to those skilled in the art.

Once the wafer has been placed on the wafer pedestal 36, the cool chamber 20 is filled with a gas, such as Argon, to 2 Torr of vacuum at 200 mTorr per minute, for approximately 10 seconds. The gas is introduced via the gas inlet 150, through the T-shaped portion 148 and the second portion 152, the elbow joint 88, the internal fitting 84, and the connector 86 into the lumen of the circular tube 72, where the gas is then emitted via the outlets, the vertical tubes 76 and the vent diffusers 82. Since the vent diffusers 82 are spaced apart around the wafer, the flow of the introduced gas evenly distributed and the velocity of the gas particles introduced into the chamber at any single location is also reduced and distributed, thereby minimizing the possibility of generating unwanted particles from the wafer. The wafer sits in the 2 Torr of vacuum for 20 to 30 seconds, depending on the required process for each wafer, after which the wafer should be sufficiently cool. For example, each PVD chamber 17 subjects the wafer to different temperatures, so different cooling times are needed for wafers subjected to different processes.

The wafer is now ready to be removed. To do so, the wafer lift 44 is raised in the vertical direction indicated by the arrow denoted "A". An isolation valve 204 between the cool chamber 20 and the buffer chamber 206 is opened. At this time, the bypass valve 170 opens. In other words, the open control line that opens the isolation valve 200 is tied into the bypass valve 170, so that when the isolation valve 204 opens, the bypass valve 170 opens as well. As noted earlier, the bypass valve 170, unlike the isolation valves, is normally closed via a spring and opens only when air is provided through the open control line. When the bypass valve 170 is open, gas can flow out of the manifold assembly 22, through the fill port 70 and the U-shaped tube 182, and through the bypass port 120, back into the cool chamber 20. The bypass port assembly 26 is provided to maintain the vacuum level between the transfer chamber 202 and the cool chamber 20 at similar levels. Otherwise, the pressure in the transfer chamber 202 may be higher than what was previously obtained, which can cause the pressure in the transfer chamber 202 to rise, resulting in a higher than normal level of gaseous contamination (i.e., water, carbon, oxygen, etc.) in the other chambers. In this regard, since the manifold assembly 22 (by its own nature) restricts gas flow, the vacuum level in the manifold assembly 22 must be quickly brought back to the same level as the vacuum level for the remainder of the cool chamber 20. This is accomplished by looping the fill port 70 back to the bypass port 120 to provide another conduit that is less restrictive (other than through the vent diffusers 82) for the gas and vacuum to be distributed more quickly. Once the isolation valve 204 has been opened, the first robot device 13 extends into the cool chamber 20. The wafer lift 44 retracts downwardly in the vertical direction indicated by the arrow denoted "B", and leaves the wafer on the blade of the first robot device 13 as the wafer lift 44 retracts downwardly. The first robot device 13 then picks up the wafer, retracts then rotates and places the cooled wafer into the second load lock 12. The isolation valve 204 between the cool chamber 20 and the buffer chamber 206 is then closed, and is ready to receive the next wafer or batch of wafers for cooling.

Thus, the cool chamber 20 of the present invention provides a manifold assembly 22 that evenly distributes the flow of cooling gas that is directed at the wafer and reduces and redistributes the velocity of the gas particles introduced into the chamber at any single location, thereby minimizing the possibility of generating unwanted particles from inside the cool chamber 20. The cool chamber 20 of the present invention further provides a bypass valve assembly 26 to regulate the vacuum level in the cool chamber 20.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. A cool chamber, comprising:
   a housing having a pedestal for supporting a wafer to be cooled, said pedestal having a support surface in a horizontal plane;
   a gas inlet for receiving a gas;
   a first port coupled to the gas inlet;
   a manifold assembly, coupled to the first port, for conducting gas into the cool chamber, said manifold assembly being disposed in a plane different from the horizontal plane of the pedestal support surface; and
   said manifold assembly having a plurality of spaced-apart outlets positioned to surround the pedestal, for introducing gas into the chamber in a diffused manner.

2. A cool chamber, comprising:
   a housing having a pedestal for supporting a wafer to be cooled;
   a gas inlet for receiving a gas;
   a first port coupled to the gas inlet; and
   a manifold assembly, coupled to the first port, for conducting gas into the cool chamber, said manifold assembly having a plurality of spaced-apart outlets positioned to surround the pedestal, the outlets directing the gas from different directions towards the wafer pedestal, wherein the manifold assembly further includes a vent diffuser, disposed at each outlet, for providing point-of-use filtering of the gas and diffusion of the gas thereat.

3. The chamber of claim 2, wherein each vent diffuser further includes:
   (a) a mating nut;
   (b) a gland coupled to the outlet; and
   (c) a sintered gasket interposed between the mating nut and the gland.

4. The chamber of claim 3, wherein the sintered gasket defines a mesh having a plurality of pores, each pore having a pore size less than a predetermined pore size for filtering particles that are greater than the predetermined pore size, said mesh diffusing and filtering gas passing therethrough.

5. The chamber of claim 2, wherein the manifold assembly includes a generally circular tubular body having a plurality of vertical tubes, each vertical tube extending from each outlet and coupling one vent diffuser.

6. A cool chamber, comprising:
   a housing having a pedestal for supporting a wafer to be cooled;
   a gas inlet for receiving a gas;
   a first port coupled to the gas inlet;
   a manifold assembly, coupled to the first port, for conducting gas into the cool chamber, said manifold assembly having a plurality of spaced-apart outlets positioned to surround the pedestal, the outlets directing the gas from different directions towards the wafer pedestal;
   an adapter plate defining a bypass port;
   a pipe connecting the bypass port to the first port for conducting gas from the manifold assembly back into the chamber during de-pressurization; and
   a valve, coupled to the bypass port and the first port, for selectively connecting the first port to the bypass port.

7. A chamber of claim 6, wherein the valve is a pneumatic valve that is controlled by pressure.

8. The chamber of claim 7, wherein the pressure is also provided to an isolation valve disposed between the cool chamber an another chamber so that when the isolation valve is opened, the pneumatic valve is also opened.

9. The chamber of claim 2, wherein the manifold is generally circular, and wherein the vent diffusers are disposed approximately equidistant from each other along the manifold.

10. A method of cooling a wafer in a chamber, comprising the steps of:
   a. loading the wafer into the chamber;
   b. opening a first port to allow gas to enter the chamber; and
   c. introducing and diffusing the gas at a plurality of locations about the chamber.

11. A method of cooling a wafer in a chamber, comprising the steps of:
   a. loading the wafer into the chamber;
   b. opening a first port to allow gas to enter the chamber;
   c. directing the gas towards the wafer from at least two different directions; and d. simultaneously opening an isolation valve and a bypass valve to de-pressurize the chamber.

12. A method of cooling a wafer in a chamber, comprising the steps of:
   a. loading the wafer into the chamber;
   b. opening a first port to allow gas to enter the chamber;
   c. directing the gas towards the wafer from at least two different directions; and
   d. providing a bypass conduit for distributing the gas and vacuum in the chamber during de-pressurization.

* * * * *